United States Patent
Wei et al.

(10) Patent No.: US 9,383,399 B2
(45) Date of Patent: Jul. 5, 2016

(54) HRG GROUND FAULT DETECTOR AND METHOD USING PHASE INPUTS TO GENERATE A SIMULATED NEUTRAL VOLTAGE

(71) Applicant: ROCKWELL AUTOMATION TECHNOLOGIES, INC., Mayfield Heights, OH (US)

(72) Inventors: Lixiang Wei, Whitefish Bay, WI (US); Jiangang Hu, Grafton, WI (US); Jeffrey D. McGuire, Franklin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 290 days.

(21) Appl. No.: 14/043,065

(22) Filed: Oct. 1, 2013

(65) Prior Publication Data
US 2015/0091582 A1    Apr. 2, 2015

(51) Int. Cl.
*G01R 31/14*    (2006.01)
*G01R 31/02*    (2006.01)
*G01R 31/42*    (2006.01)

(52) U.S. Cl.
CPC .............. *G01R 31/025* (2013.01); *G01R 31/42* (2013.01)

(58) Field of Classification Search
CPC ...... G01R 31/025; G01R 27/18; G01R 31/08; G01R 31/1272; H02H 3/105; H02H 3/16; H02H 3/50; H02H 7/0833; H02H 9/08; H02M 1/32; H02P 29/02; G01H 13/00
See application file for complete search history.

(56) References Cited

U.S. PATENT DOCUMENTS

| | | | |
|---|---|---|---|
| 4,151,460 A | 4/1979 | Seese et al. | |
| 4,878,142 A * | 10/1989 | Bergman | G01R 31/025 324/509 |
| 7,154,277 B2 | 12/2006 | Vallinmaki et al. | |
| 2003/0197989 A1* | 10/2003 | Nojima | B60L 3/00 361/47 |
| 2007/0229090 A1 | 10/2007 | Kumar | |
| 2012/0086458 A1 | 4/2012 | Wei et al. | |
| 2012/0112757 A1 | 5/2012 | Vrankovic et al. | |
| 2012/0249038 A1 | 10/2012 | Wei et al. | |
| 2013/0218491 A1* | 8/2013 | Wei | G01R 31/42 702/58 |

* cited by examiner

*Primary Examiner* — Vinh Nguyen

(57) ABSTRACT

A HRG ground fault detector and method for detecting a ground fault in a High Resistance Ground (HRG) system are provided. The HRG ground fault detector in one example embodiment includes a first input A coupled to a first phase $PH_A$ of the HRG system, a second input B coupled to a second phase $PH_B$, and a third input C coupled to a third phase $PH_C$, with the HRG ground fault detector generating a simulated neutral voltage $V_{N'}$ from the first phase $PH_A$, the second phase $PH_B$, and the third phase $PH_C$. The simulated neutral voltage $V_{N'}$ has a zero voltage potential when the first phase $PH_A$, the second phase $PH_B$, and the third phase $PH_C$ are equal. The HRG ground fault detector further compares the simulated neutral voltage $V_{N'}$ to a predetermined fault voltage threshold, and detects a HRG ground fault if the simulated neutral voltage $V_{N'}$ exceeds the threshold.

20 Claims, 5 Drawing Sheets

HRG GROUND FAULT DETECTOR AND METHOD USING PHASE INPUTS TO GENERATE A SIMULATED NEUTRAL VOLTAGE

TECHNICAL BACKGROUND

In voltage power conversion circuits, electrical power can be converted from an alternating current (AC) power into direct current (DC) power via a power converter or AC/DC converter. The DC power can then be converted back into AC power, but into AC power with a desired frequency, phase, and amplitude. The generated AC power is then applied to drive an external load, such as an electric motor.

A three-phase electric drive circuit may comprise a HRG system wherein the neutral node N of the three-phase power input is grounded through a high resistance component. The HRG system includes a heavy-duty resistance device between a neutral node and the ground of the input AC source of the system such that the system can operate under single ground faulted condition by allowing a reduced, non-destructive ground fault current. The HRG system therefore allows the drive system to operate under ground fault conditions, and is a preferred grounding method for many applications.

A HRG fault typically generates small amounts of ground current and may not even be noticeable or measurable in motor drive circuits. Because the fault current is often negligible, it is difficult to reliably differentiate faults from large changes of the load. However, because stresses on the component, motor, or cable in a HRG system become higher under a ground fault condition, it is critical to identify the HRG fault when it occurs. The user may be notified and maintenance may be recommended, including providing an indication of where the ground fault exists.

For a HRG system wherein an adjustable speed drive is applied, the ground fault currents at the drive circuit output are highly dependent on the output frequency of the drive circuit. At a low motor speed, the fault current may be lower than the HRG fault threshold and therefore may not trigger a ground fault indication. If both high and low output frequencies are considered, a false trigger may be generated when the cable lengths of the inverter are long.

OVERVIEW

In an embodiment, a HRG ground fault detector for detecting a ground fault in a High Resistance Ground (HRG) system is provided. The HRG ground fault detector includes a first input A adapted to be coupled to a first phase $PH_A$ of the HRG system, a second input B adapted to be coupled to a second phase $PH_B$ of the HRG system, and a third input C adapted to be coupled to a third phase $PH_C$ of the HRG system, with the HRG ground fault detector being configured to generate a simulated neutral voltage $V_{N'}$ from the first phase $PH_A$, the second phase $PH_B$, and the third phase $PH_C$, wherein the simulated neutral voltage $V_{N'}$ comprises a zero voltage potential when the first phase $PH_A$, the second phase $PH_B$, and the third phase $PH_C$ are equal, compare the simulated neutral voltage $V_{N'}$ to a predetermined fault voltage threshold, and detect a HRG ground fault in the HRG system if the simulated neutral voltage $V_{N'}$ exceeds the predetermined fault voltage threshold.

This Overview is provided to introduce a selection of concepts in a simplified form that are further described below in the Technical Disclosure. It should be understood that this Overview is not intended to identify key features or essential features of the claimed subject matter, nor is it intended to be used to limit the scope of the claimed subject matter.

DETAILED DESCRIPTION

The following description and associated drawings teach the best mode of the invention. For the purpose of teaching inventive principles, some conventional aspects of the best mode may be simplified or omitted. The following claims specify the scope of the invention. Some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by claims and their equivalents.

A HRG fault detector and method are provided that can detect ground faults in a high resistance ground (HRG) system 150, such as a power conversion circuit employed in a motor drive system. The HRG fault detector and method can detect HRG ground faults over a full frequency and/or motor speed range. The HRG fault detector and method can accurately and reliably detect HRG ground faults.

Figure 1:
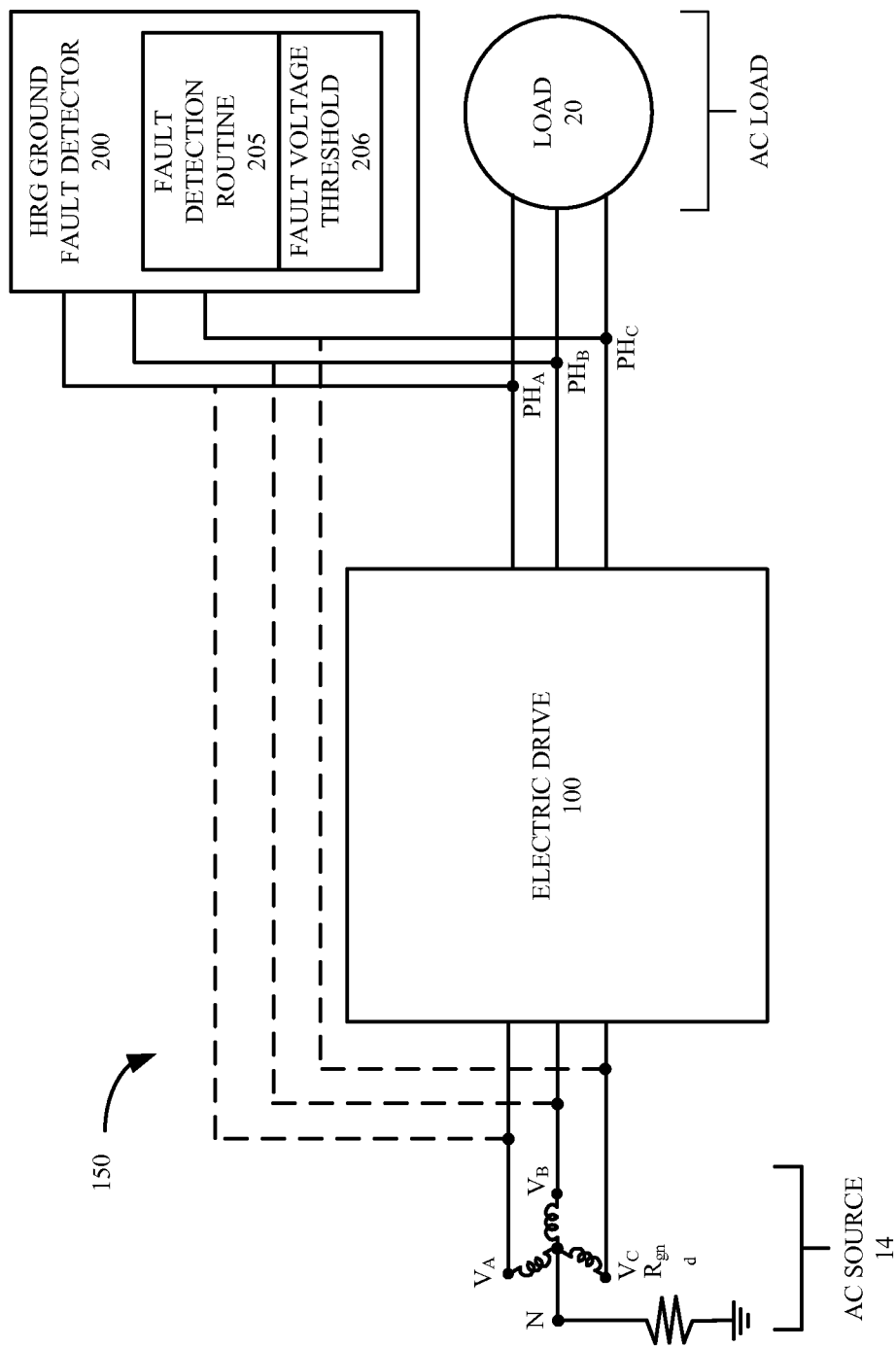
FIG. 1 shows a High Resistance Ground (HRG) ground fault detector configured to detect one or more ground faults in an electric drive.

FIG. 1 shows a HRG ground fault detector 200 configured to detect one or more ground faults in a HRG system 150 including an electric drive 100. The electric drive 100 can comprise a HRG or non-HRG circuit.

The electric drive 100 outputs a first output phase $PH_A$, a second output phase $PH_B$, and a third output phase $PH_C$. While the illustrated embodiment depicts three-phase voltages, it should be understood that in different embodiments the electric drive 100 may be suitable for inputting and outputting voltages of different phases (e.g., two-phase voltages).

The electric drive 100 is configured to drive a load 20, such as a three-phase electric motor 20, for example. The load 20 is coupled to the first output phase $PH_A$, the second output phase $PH_B$, and the third output phase $PH_C$.

An AC power source 14 supplies three-phase electrical power to the electric drive 100, as indicated by the three power nodes $V_A$, $V_B$, and $V_C$. The AC power source 14 includes a neutral node N. The AC power source 14 comprises a HRG power source wherein the three-phase neutral node N is grounded through a high-resistance resistor $R_{gnd}$. If all three phases of the AC source 14 are equal (i.e., they do not differ in phase or amplitude), then the neutral node N will remain at a zero voltage. However, in use, some imbalance may exist. Such imbalance can create a voltage potential at the neutral node N.

The HRG ground fault detector 200 in one example is coupled to and receives the three phase outputs $PH_A$, $PH_B$, and $PH_C$ of the electric drive 100. The HRG ground fault detector 200 monitors the three phase outputs $PH_A$, $PH_B$, and $PH_C$. The HRG ground fault detector 200 detects ground fault occurrences within the electric drive 100 from the three phase outputs $PH_A$, $PH_B$, and $PH_C$. The HRG ground fault detector 200 can detect ground fault occurrences within the electric drive 100 without being coupled to internal components of the electric drive 100. Alternatively, the HRG ground fault detector 200 can be coupled to the inputs or power nodes $V_A$, $V_B$, and $V_C$ of the electric drive 100 (see dashed lines).

In the past, the neutral node N of the AC power source 14 was not grounded or in any way protected from electrical discharge. As a result, an accidental electrical path from the neutral node N to ground could produce an electrical discharge, and sometimes a very dangerous and destructive electrical discharge. If a person touched a motor casing or other conductive component associated with the drive or motor, the person could receive a significant shock.

Later developments in three-phase systems added a ground line to the neutral node N, such as a wire or conductor that connected the neutral node N directly to ground. As a result, if a voltage potential developed at the neutral node N, it would be drained away, eliminating the risk of electrical shock or electrocution to persons who might come into contact with the motor or motor drive. However, a straight grounding arrangement had drawbacks. A straight grounding arrangement allows a large electrical current to flow electrical fault current still presents a danger to nearby persons.

The newest development in addressing the voltage potential at the neutral node N is the HRG system 150. The HRG system 150 was developed to address and minimize the potential discharge risk. In a HRG system 150, the neutral node N of a three-phase system is coupled to ground through a high resistance component, wherein only a limited electrical current can flow from the neutral node N to ground. This limits the instantaneous electrical current that can be discharged through the neutral node N. The HRG system 150 also limits the damage that can be done to the motor and motor drive by an electrical discharge and lessens the danger of electrocution.

A drawback of the HRG system 150 is that the HRG system 150 complicates the determination of whether a ground fault is present in the electric drive or in the motor. Further, it is desired that ground fault detection be performed for an electric drive without the need for measurements within the electric drive.

A ground fault may refer to any short-circuit or improper current flow between the electric drive 100 and ground. One advantage of HRG systems is that the electric drive 100 may operate under ground fault conditions. However, prolonged drive operation during ground fault conditions are undesirable. Unfortunately, HRG faults are generally difficult to detect. Especially in larger drives, HRG faults typically generate a relatively small amount of ground current that may be difficult to measure. Typically, the ground current on the inverter side depends on the amplitude of the output phase voltage or the output frequency of the inverter output. Therefore, in electric drives 100 operating over a variable range of speeds, the fault current may be difficult to detect. If the adjustable speed drive is operating at a relatively low speed, the ground current may be lower than a threshold level for detecting a fault condition.

Where the load 20 is an electric motor, the frequency at the three phase outputs $PH_A$, $PH_B$, and $PH_C$ will vary with the motor speed. The HRG ground fault detector 200 can detect ground fault occurrences within the electric drive 100 regardless of the motor speed, the output frequency of the electric drive 100, or other load conditions.

The HRG ground fault detector 200 is not coupled to the neutral node N of the three-phase power supply. Instead, the HRG ground fault detector 200 re-creates the neutral node N (i.e., creates a simulated neutral node N' 240) for the purpose of determining if the neutral node N is experiencing any voltage bias. In operation, the HRG ground fault detector 200 generates a simulated neutral voltage $V_{N'}$ from the first phase $PH_A$, the second phase $PH_B$, and the third phase $PH_C$, wherein the simulated neutral voltage $V_{N'}$ comprises a zero voltage potential when the first phase $PH_A$, the second phase $PH_B$, and the third phase $PH_C$ are equal. The HRG ground fault detector 200 quantifies the voltage at the simulated neutral node N' 240 without measuring voltage or current within the electric drive 100. The HRG ground fault detector 200 detects ground faults in the electric drive 100 without requiring internal components to be located in or added to the electric drive 100.

The fault detection routine 205 comprises operating instructions that configure the HRG fault detector 200 when the fault detection routine 205 is executed by the HRG fault detector 200. The fault detection routine 205, when executed by the HRG fault detector 200, may direct the HRG fault detector 200 to generate a simulated neutral voltage $V_{N'}$ from the first phase $P_{HA}$, the second phase $P_{HB}$, and the third phase $P_{HC}$, wherein the simulated neutral voltage $V_{N'}$ comprises a zero voltage potential when the first phase $P_{HA}$, the second phase $P_{HB}$, and the third phase $P_{HC}$ are equal, compare the simulated neutral voltage $V_{N'}$ to a predetermined fault voltage threshold, and detect a HRG ground fault in the HRG system 150 if the simulated neutral voltage $V_{N'}$ exceeds the predetermined fault voltage threshold.

The fault voltage threshold may be set for a particular motor electric drive 100 or may vary based on different motor drive configurations, system configurations, drive applications, operating parameters, etc. Furthermore, in some embodiments, different fault voltage thresholds may be appropriate for different operating conditions of the electric drive 100 or for various systems in which the electric drive 100 is configured. The HRG fault detector 200 may store multiple different thresholds and the processing system 260 may access the storage system 261 to obtain an appropriate threshold or thresholds according to the electric drive 100 and/or according to operating conditions. Optionally, the processing system 260 may store detected fault and/or operating conditions in the storage system 261. The detected faults and/or operating conditions can be accessed by an operator or can be otherwise processed, communicated, and/or analyzed. The detected faults and/or operating conditions can be compiled into an error log or logs for processing to determine causes of detected fault conditions.

During a fault condition, the amplitude of the simulated neutral voltage $V_{N'}$ may vary, depending on the operating frequency of the DC/AC converter 18. During high operating frequency periods, the amplitude of the simulated neutral voltage $V_{N'}$ may be substantially higher than a fault voltage threshold. However, during low operating frequency periods, the amplitude of the simulated neutral voltage $V_{N'}$ may be substantially lower than the fault voltage threshold, even where the same fault exists. Therefore, while a high frequency fault period may be reasonably detectable, a low frequency fault period is more difficult to distinguish from proper operation and therefore is much more difficult to reliably and accurately detect. However, the integrated simulated neutral voltage (i.e., $V_{INT}$) has a relatively constant amplitude, having substantially the same amplitude during a high frequency fault as during a low frequency fault. Consequently, the integrated $V_{INT}$ signal results in a more identifiable fault, whether the DC/AC converter 18 is operating at high or low frequencies.

The determination of the HRG ground fault can be accompanied by generating a ground fault indication. The ground fault indication may comprise an indication to a user of the HRG ground fault detector 200, for example. The indication may comprise a visual and/or auditory indication to the user of the HRG ground fault detector 200. The indication may comprise a message, signal, or other communication transmitted in any manner to the user of the HRG ground fault detector 200 or to a monitoring station or controller. However, it should be understood that the ground fault may be indicated in any suitable fashion. In systems with multiple electric drives 100 and/or multiple loads 20, the processing system 260 may indicate which drive circuit is in fault, such that an operator of the system may attend the particular drive that is in fault.

Figure 2:
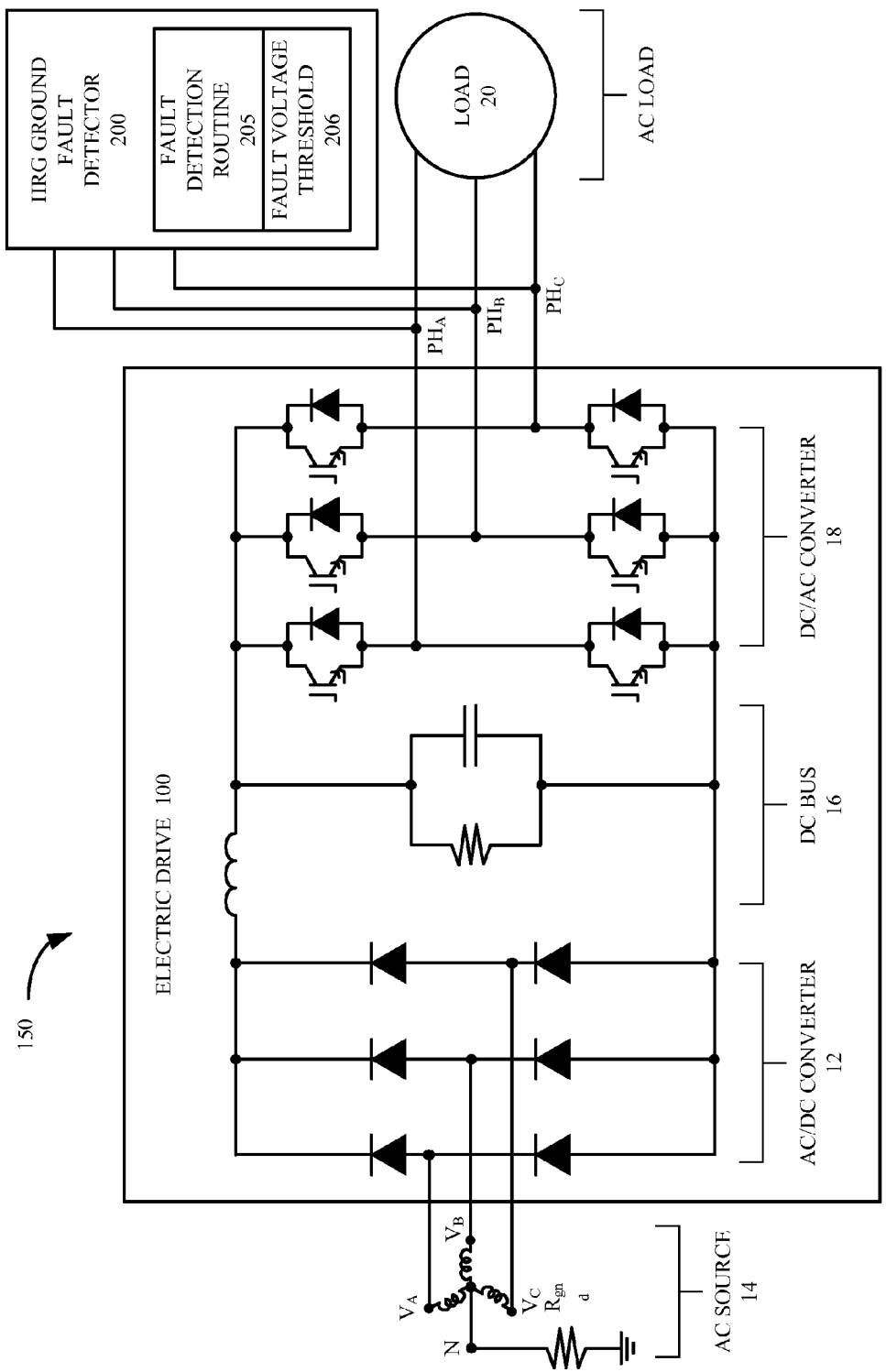
FIG. 2 shows an exemplary electric drive.

FIG. 2 shows an exemplary electric drive 100. The electric drive 100 in the example shown comprises an AC/DC converter 12, a DC bus 16, and a DC/AC converter 18. The AC/DC converter 12 receives the AC input power from the AC power source 14. The AC/DC converter 12 converts the AC power into DC power. The AC/DC converter 12 (also referred to as a rectifier 12) rectifies the incoming AC voltage to DC voltage in one direction to output a discretized output voltage waveform through the DC bus 16. The DC bus 16 receives the DC power from the AC/DC converter 12. The DC bus 16 filters and conditions the DC power. The DC/AC converter 18 receives the DC power from the DC bus 16. The DC/AC converter 18 converts the DC power to AC power at any desired frequency and outputs the AC power at the three phase outputs $PH_A$, $PH_B$, and $PH_C$. Depending on the electrical system in which the electric drive 100 is operating, different types of voltage may be supplied to the load 20.

The AC/DC converter 12 in the example shown includes an arrangement of components that form a rectifier. The rectifier can comprise thyristors arranged in an integrated diode bridge configuration. The rectifier can comprise an arrangement of diodes, a rectifier bridge module, or active control pulse width modulating (PWM) rectifiers.

The DC/AC converter 18 in the example shown includes an array of power diodes and transistors, wherein each diode is configured anti-parallel to the respective transistor. The discretized output voltage from the DC bus 16 is switched by the transistors, which are configured to switch at a certain switching frequency to output voltages to the load 20. However, the configurations of the AC/DC converter 12 and the DC/AC converter 18 may be varied, depending on the operating voltage(s) of the electric drive 100.

Figure 3:
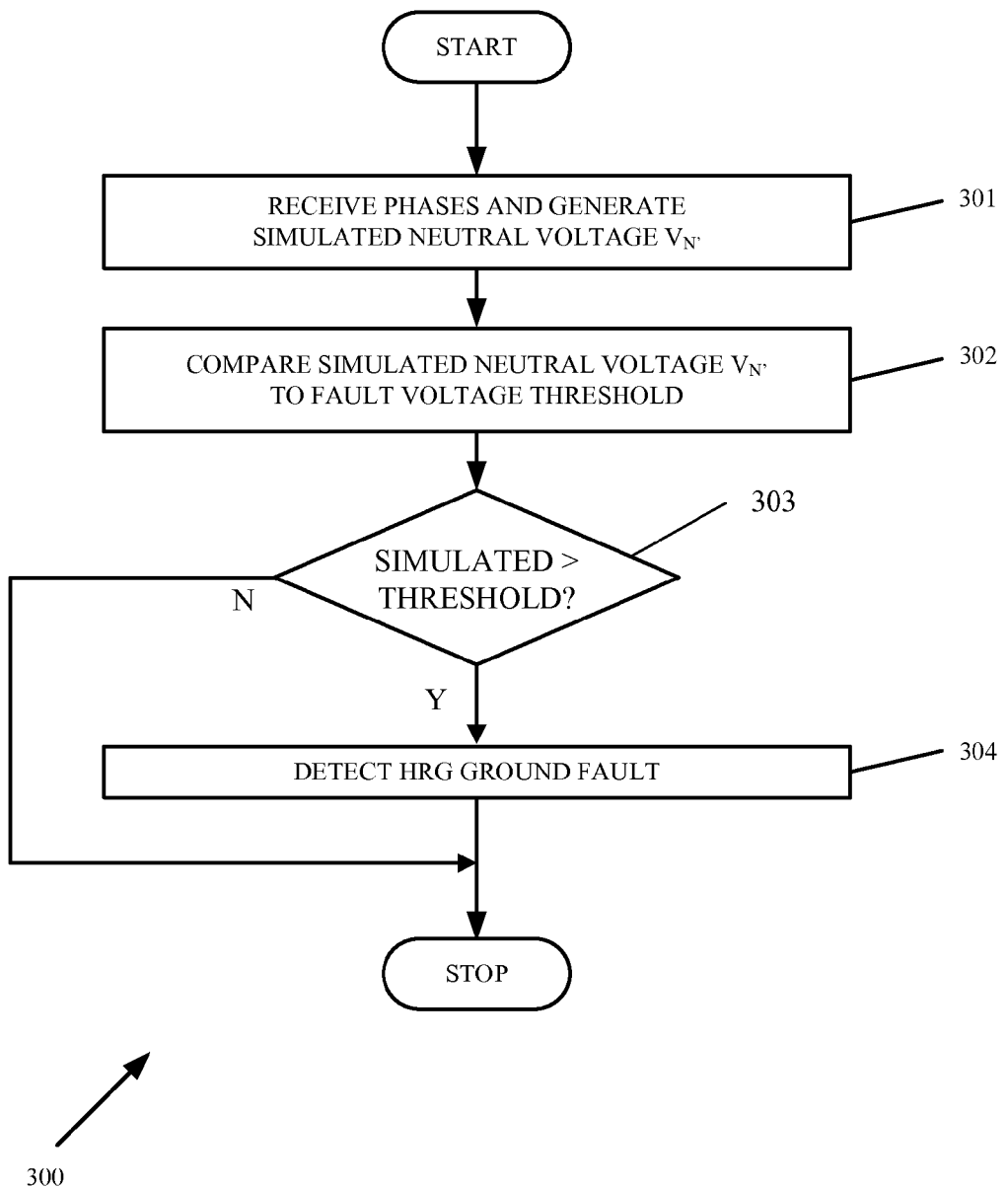
FIG. 3 is a flowchart of a method of HRG ground fault detection in a HRG system.

FIG. 3 is a flowchart 300 of a method of HRG ground fault detection in a HRG system. In step 301, a first phase $PH_A$, a second phase $PH_B$, and a third phase $PH_C$ are received from the HRG system. The HRG system can comprise an electric drive, for example. The HRG system can comprise an electric drive for driving an electric motor, for example.

In step 302, a simulated neutral voltage $V_{N'}$ is generated from the first phase $PH_A$, the second phase $PH_B$, and the third phase $PH_C$. The simulated neutral voltage $V_{N'}$ is formed at a simulated neutral node, wherein the simulated neutral node is not in the circuit being tested. The simulated neutral voltage $V_{N'}$ will be at a zero voltage potential if the first phase $PH_A$, the second phase $PH_B$, and the third phase $PH_C$ are equal. However, if a ground fault exists in any of the three phases $PH_A$, $PH_B$, or $PH_C$, then the simulated neutral voltage $V_{N'}$ will not be at a zero voltage potential. As a result, the simulated neutral voltage $V_{N'}$ can be used to determine whether a HRG ground fault exists in the HRG system.

In step 303, the simulated neutral voltage $V_{N'}$ is compared to a predetermined fault voltage threshold. The predetermined fault voltage threshold is a maximum allowable value for the simulated neutral voltage $V_{N'}$ in a non-fault situation. As a result, simulated neutral voltages $V_{N'}$ above the predetermined fault voltage threshold comprise voltages large enough to be considered ground fault conditions. If the simulated neutral voltage $V_{N'}$ is not greater than the fault voltage threshold, then the method branches around step 304. Otherwise, where the simulated neutral voltage $V_{N'}$ is greater than the fault voltage threshold, the method proceeds to step 304.

In step 304, a HRG ground fault is determined to exist in the HRG system where the simulated neutral voltage $V_{N'}$ exceeds the fault voltage threshold. The determination of the HRG ground fault can be accompanied by generating a ground fault indication. The ground fault indication may comprise an indication to a user of the HRG ground fault detector 200, for example. The indication may comprise a visual and/or auditory indication to the user of the HRG ground fault detector 200. The indication may comprise a message, signal, or other communication transmitted in any manner to the user of the HRG ground fault detector 200 or to a monitoring station or controller. However, it should be understood that the ground fault may be indicated in any suitable fashion.

The fault voltage threshold may be set for a particular motor electric drive 100 or may vary based on different motor drive configurations, system configurations, drive applications, operating parameters, etc. Furthermore, in some embodiments, different fault voltage thresholds may be appropriate for different operating conditions of the electric drive 100 or for various systems in which the electric drive 100 is configured. The HRG fault detector 200 may store multiple different thresholds and the processing system 260 may access the storage system 261 to obtain an appropriate threshold or thresholds according to the electric drive 100 and/or according to operating conditions. Optionally, the processing system 260 may store detected fault and/or operating conditions in the storage system 261. The detected faults and/or operating conditions can be accessed by an operator or can be otherwise processed, communicated, and/or analyzed. The detected faults and/or operating conditions can be compiled into an error log or logs for processing to determine causes of detected fault conditions.

Figure 4:
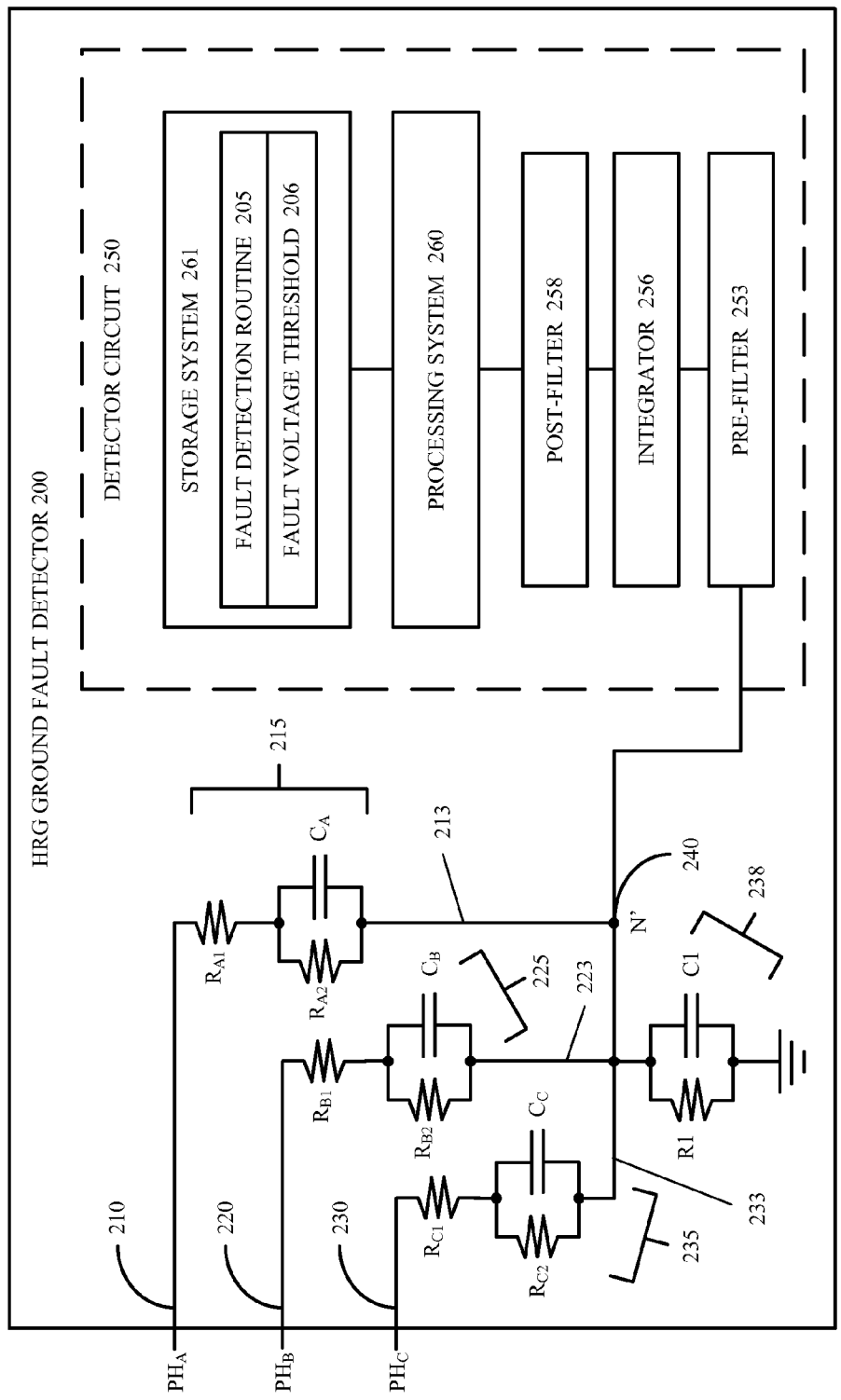
FIG. 4 shows the HRG ground fault detector in another example.

FIG. 4 shows the HRG ground fault detector 200 in another example. The HRG ground fault detector 200 in the example shown includes a first phase input $PH_A$ 210, a second phase input $PH_B$ 220, and a third phase input $PH_C$ 230. The first phase input $PH_A$ 210 is coupled to a first input network 215, with the first input network 215 including a first network output 213. The first network output 213 is coupled to a neutral node N' 240. The second phase input $PH_B$ 220 is coupled to a second input network 225, with the second input network 225 including a second network output 223. The second network output 223 is coupled to the neutral node N' 240. The third phase input $PH_A$ 230 is coupled to a third input network 235, with the third input network 235 including a third network output 233. The third network output 213 is coupled to the neutral node N' 240. The input networks 215, 225, and 235 transfer the three phases $PH_A$, $PH_B$, and $PH_C$ into the HRG ground fault detector 200, but limit current flow into the HRG ground fault detector 200. The input networks 215, 225, and 235 are shown as comprising resistors and capacitors, but it should be understood that the input networks 215, 225, and 235 can be formed of any suitable electronic components.

A base network 238 is coupled between the neutral node N' 240 and ground. The base network 238 generates a simulated neutral voltage $V_{N'}$ at the neutral node N' 240. It should be understood that the simulated neutral voltage $V_{N'}$ will be substantially the same as the voltage at the neutral node N of the AC power source 14 in FIG. 1. The base network 238 will generate the simulated neutral voltage $V_{N'}$ if the three phases $PH_A$, $PH_B$, and $PH_C$ are not equal. The simulated neutral voltage $V_{N'}$ will be at a zero voltage potential if the first phase $PH_A$, the second phase $PH_B$, and the third phase $PH_C$ are equal. However, if a ground fault exists in any of the three phases $PH_A$, $PH_B$, or $PH_C$, then the simulated neutral voltage $V_{N'}$ will not be at a zero voltage potential. As a result, the simulated neutral voltage $V_{N'}$ can be used to determine whether a HRG ground fault exists in the HRG system 150. Although the base network 238 is shown as comprising resistors and capacitors, it should be understood that the base network 238 can be formed of any suitable electronic components.

A detector circuit 250 is coupled to the neutral node N' 240 and receives the simulated neutral voltage $V_{N'}$. The detector circuit 250 processes the simulated neutral voltage $V_{N'}$ to determine whether a HRG ground fault is detected. The detector circuit 250 compares the simulated neutral voltage $V_{N'}$ to the predetermined ground fault threshold 206 and detects a HRG ground fault if the simulated neutral voltage $V_{N'}$ exceeds the predetermined ground fault threshold 206.

In the example shown, the detector circuit 250 includes a pre-filter 253 coupled to the neutral node N' 240, an integrator 256 coupled to the pre-filter 253, a post-filter 258 coupled to the integrator 256, and a processing system 260 coupled to the post-filter 258. The processing system 260 receives an integrated voltage $V_{INT}$ comprising a filtered and integrated version of the simulated neutral voltage $V_{N'}$ at the neutral node N' 240.

The processing system 260 is coupled to a storage system 261. The storage system 261 can be integral to the processing system 260 or can comprise a storage that is in communication with the processing system 260. The storage system 261 stores the fault detection routine 205 and the predetermined fault voltage threshold 206, for example. The storage system 261 may store other and additional information, which is not shown for clarity.

The processing system 260 can comprise one or more microprocessors and other circuitry that retrieves and executes the fault detection routine 205 from the storage system 261. The processing system 260 can be implemented within a single processing device but can also be distributed across multiple processing devices or sub-systems that cooperate in executing program instructions. Examples of the processing system 260 include general purpose central processing units, application specific processors, and logic devices, as well as any other type of processing device, combinations, or variations thereof.

The fault detection routine 205 comprises operating instructions that configure the processing system 260, when the fault detection routine 205 is executed by the processing system 260. The fault detection routine 205, when executed by the processing system 260, may direct the HRG ground fault detector 200 to receive a first phase $PH_A$ of the HRG system 150, receive a second phase $PH_B$ of the HRG system 150, receive a third phase $PH_C$ of the HRG system 150, generate a simulated neutral voltage $V_{N'}$ from the first phase $PH_A$, the second phase $PH_B$, and the third phase $PH_C$, wherein the simulated neutral voltage $V_{N'}$ comprises a zero voltage potential when the first phase $PH_A$, the second phase $PH_B$, and the third phase $PH_C$ are equal, integrate the simulated neutral voltage $V_{N'}$ wherein the integrated voltage $V_{INT}$ is substantially constant in amplitude regardless of a frequency at the first phase $PH_A$, the second phase $PH_B$, and the third phase $PH_C$, compare the integrated voltage $V_{INT}$ to a predetermined fault voltage threshold 206, and detect a HRG ground fault in the HRG system 150 if the integrated voltage $V_{INT}$ exceeds the predetermined fault voltage threshold 206.

Figure 5:
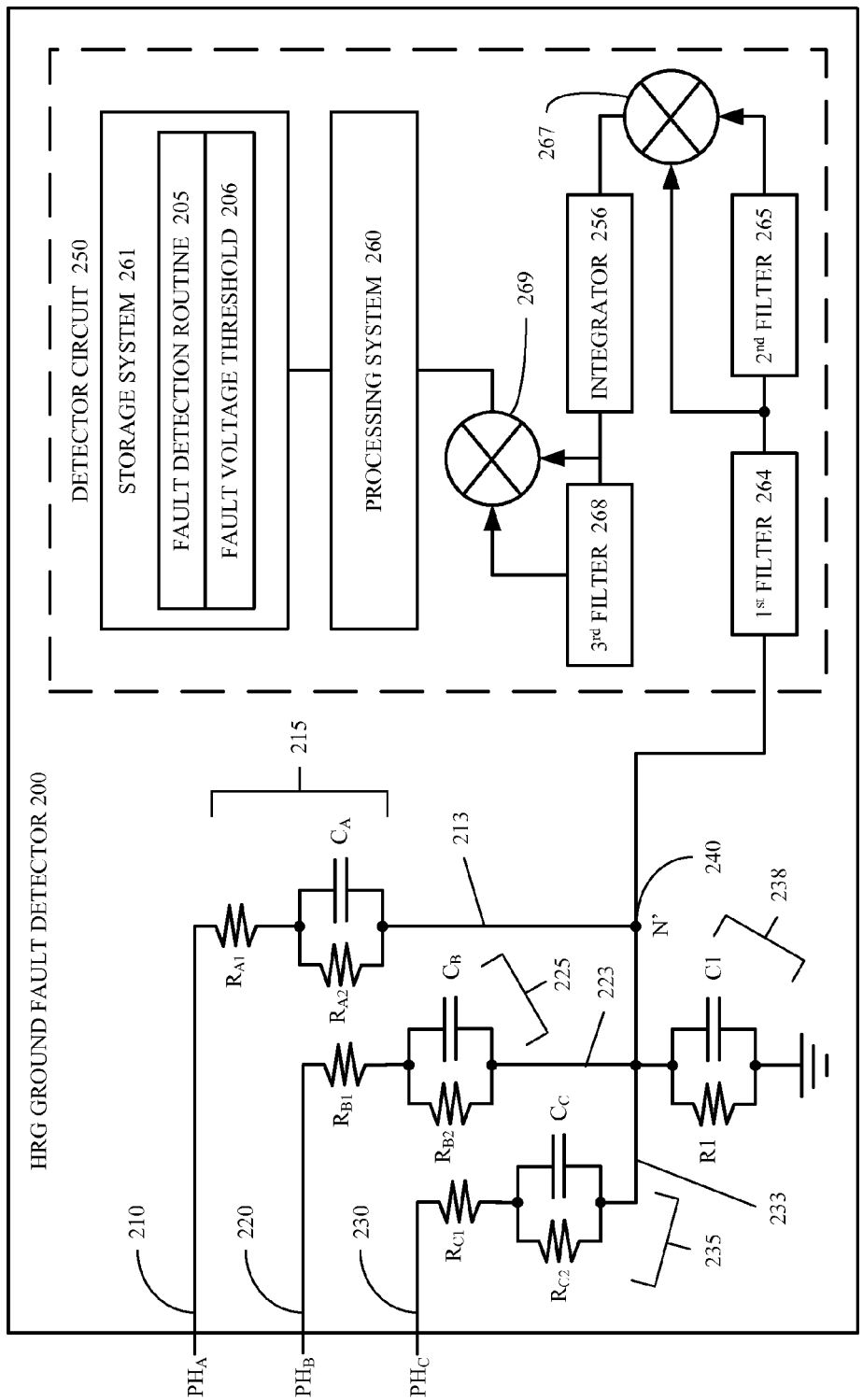
FIG. 5 shows the HRG ground fault detector in another example.

FIG. 5 shows the HRG ground fault detector 200 in another example. The HRG ground fault detector 200 in the example shown includes the components of FIG. 4 and additionally includes a first low-pass (LP) filter 264, a second LP filter 265, a first mixer 267, the integrator 256, a third LP filter 268, and a second mixer 269.

The first filter 264, the second filter 265, and the first mixer 267 replace the pre-filter 253 of FIG. 4. The first and second filters 264 and 265 in this example comprise low-pass (LP) filters that pass low frequency signals and do not pass high frequency signals. Filter cut-off points of the first and second filters 264 and 265 can be set as desired, such as above an expected frequency operating range of the DC/AC converter 18 of the electric drive 100, for example. In the example shown, the first and second filters 264 and 265 are configured to smooth out the DC bias present in the simulated neutral voltage $V_{N'}$ before the integration. It should be understood that the first and second filters 264 and 265 are not limited to low-pass filters and can comprise any suitable filters.

The first mixer 267 combines the outputs of the first and second filters 264 and 265. The first mixer 267 provides the combined filtered signals to the integrator 256. The first mixer 267 therefore provides a filtered simulated neutral voltage $V_{N'}$ to the integrator 256.

The integrator 256 integrates the filtered simulated neutral voltage $V_{N'}$ and generates an integrated neutral voltage $V_{INT}$. The integrator 256 provides an integration of the simulated neutral voltage $V_{N'}$. The simulated neutral voltage $V_{N'}$ will have an amplitude of $V_{phase}/f_0$, where $V_{phase}$ is the phase voltage and $f_0$ is the fundamental frequency at the output of the electric drive 100 (i.e., the amplitude of the simulated neutral voltage $V_{N'}$ is not fixed or unvarying, but changes with operating frequency). The integrator 256 provides the integrated neutral voltage $V_{INT}$ to the third filter 268 and the second mixer 269, as shown in the figure.

The third filter 268 and the second mixer 269 in this example replace the post-filter 258 of FIG. 4. The third filter 268 in this example comprises a LP filter that passes low frequency signals and does not pass high frequency signals. The third filter 268 in the example shown is configured to remove DC bias in $V_{INT}$ before comparing $V_{INT}$ to the fault voltage threshold, wherein $V_{INT}$ now comprises a pure AC signal. It should be understood that the third filter 268 is not limited to a low-pass filter and can comprise any suitable filter.

The second mixer 269 combines the integrated neutral voltage $V_{INT}$ from the integrator 256 with the filtered $V_{INT}$ from the third filter 268. The second mixer 269 provides the filtered $V_{INT}$ to the processing system 260.

It should be noted that, while the present techniques for detecting ground fault in HRG systems are described in connection with a motor drive, the techniques are not limited to such applications. Rather, the same methodology may be utilized for detecting ground faults in a wide range of circuit applications, particularly those in which a DC bus is used in conjunction with AC/DC reactivation, or more generally conversion circuitry and DC/AC conversion circuitry.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A HRG ground fault detector configured to detect a ground fault in a High Resistance Ground (HRG) system, the HRG ground fault detector comprising:
a first input A adapted to be coupled to a first phase $PH_A$ of the HRG system;
a second input B adapted to be coupled to a second phase $PH_B$ of the HRG system; and
a third input C adapted to be coupled to a third phase $PH_C$ of the HRG system;
the HRG ground fault detector having a base network between a neutral node N' and a ground configured to generate a simulated neutral voltage $V_{N'}$ at the neutral node N' from the first phase $PH_A$, the second phase $PH_B$, and the third phase $PH_C$, wherein the simulated neutral voltage $V_{N'}$ comprises a zero voltage potential when the first phase $PH_A$, the second phase $PH_B$, and the third phase $PH_C$ are equal, and having a detector circuit configured to compare the simulated neutral voltage $V_{N'}$ to a predetermined fault voltage threshold, and detect a HRG ground fault in the HRG system if the simulated neutral voltage $V_{N'}$ exceeds the predetermined fault voltage threshold.

2. The HRG ground fault detector of claim 1, wherein the HRG ground fault detector is configured to detect the HRG ground fault independent of a frequency of the first phase $PH_A$, the second phase $PH_B$, and the third phase $PH_C$.

3. The HRG ground fault detector of claim 1, wherein the HRG system comprises an electric drive coupled to a load comprising an electric motor and wherein the HRG ground fault detector is configured to detect the HRG ground fault in the electric drive independent of a motor speed of the motor.

4. The HRG ground fault detector of claim 1, wherein the detector circuit includes an integrator coupled to the neutral node N' and wherein the HRG ground fault detector integrates the simulated neutral voltage $V_{N'}$ to generate an integrated voltage $V_{INT}$, with the integrated voltage $V_{INT}$ being substantially constant in amplitude regardless of a frequency at the first phase $PH_A$, the second phase $PH_B$, and the third phase $PH_C$.

5. The HRG ground fault detector of claim 1, wherein the detector circuit includes an integrator coupled to the neutral node N' and wherein the HRG ground fault detector integrates the simulated neutral voltage $V_{N'}$ to generate an integrated voltage $V_{INT}$, compares the integrated voltage $V_{INT}$ to a predetermined fault voltage threshold, and determines the HRG ground fault in the HRG system if the integrated voltage $V_{INT}$ exceeds the predetermined fault voltage threshold.

6. The HRG ground fault detector of claim 1, wherein the detector circuit includes an integrator, a pre-filter, and a post-filter, wherein the HRG ground fault detector filters the simulated neutral voltage $V_{N'}$ using the pre-filter, integrates the simulated neutral voltage $V_{N'}$ using the integrator to generate an integrated voltage $V_{INT}$, filters the integrated voltage $V_{INT}$ using the post-filter, compares the integrated voltage $V_{INT}$ to a predetermined fault voltage threshold, and determines the HRG ground fault in the HRG system if the integrated voltage $V_{INT}$ exceeds the predetermined fault voltage threshold.

7. The HRG ground fault detector of claim 1, wherein the detector circuit includes an integrator coupled to the neutral node N' and wherein the HRG ground fault detector integrates the simulated neutral voltage $V_{N'}$ to generate an integrated voltage $V_{INT}$, compares the integrated voltage $V_{INT}$ to a predetermined fault voltage threshold, determines the HRG ground fault if the integrated voltage $V_{INT}$ exceeds the predetermined fault voltage threshold, and determines a fundamental frequency of a faulted phase from the integrated voltage $V_{INT}$.

8. A HRG ground fault detector configured to detect a ground fault in a High Resistance Ground (HRG) system, the HRG ground fault detector comprising:
a first input A adapted to be coupled to a first phase $PH_A$ of the HRG system;
a second input B adapted to be coupled to a second phase $PH_B$ of the HRG system;
a third input C adapted to be coupled to a third phase $PH_C$ of the HRG system, with the HRG ground fault detector having a base network between a neutral node N' and a ground for generating a simulated neutral voltage $V_{N'}$ at the neutral node N' from the first phase $PH_A$, the second phase $PH_B$, and the third phase $PH_C$, wherein the simulated neutral voltage $V_{N'}$ comprises a zero voltage potential when the first phase $PH_A$, the second phase $PH_B$, and the third phase $PH_C$ are equal;
a detector circuit comprising an integrator coupled to the neutral node N' and configured to integrate the simulated neutral voltage $V_{N'}$, wherein the integrated voltage $V_{INT}$ is substantially constant in amplitude regardless of a frequency at the first phase $PH_A$, the second phase $PH_B$, and the third phase $PH_C$;
the detector circuit further comprising a processing system coupled to the integrator, with the processing system configured to compare the integrated voltage $V_{INT}$ to a predetermined fault voltage threshold and detect a HRG ground fault in the HRG system if the integrated voltage $V_{INT}$ exceeds the predetermined fault voltage threshold.

9. The HRG ground fault detector of claim 8, wherein the HRG ground fault detector is configured to detect the HRG ground fault independent of a frequency of the first phase $PH_A$, the second phase $PH_B$, and the third phase $PH_C$.

10. The HRG ground fault detector of claim 8, wherein the HRG system comprises an electric drive coupled to a load comprising an electric motor and wherein the HRG ground fault detector is configured to detect the HRG ground fault in the electric drive independent of a motor speed of the motor.

11. The HRG ground fault detector of claim 8, wherein the detector circuit includes a pre-filter and a post-filter, wherein the HRG ground fault detector filters the simulated neutral voltage $V_{N'}$ using the pre-filter, integrates the simulated neutral voltage $V_{N'}$ using the integrator to generate the integrated voltage $V_{INT}$, filters the integrated voltage $V_{INT}$ using the post-filter, compares the integrated voltage $V_{INT}$ to a predetermined fault voltage threshold, and determines the HRG ground fault in the HRG system if the integrated voltage $V_{INT}$ exceeds the predetermined fault voltage threshold.

12. The HRG ground fault detector of claim 8, wherein the HRG ground fault detector is further configured to determine a fundamental frequency of a faulted phase from the integrated voltage $V_{INT}$.

13. The HRG ground fault detector of claim 8, wherein the received first phase $PH_A$ is coupled to a neutral node N', the received second phase $PH_B$ is coupled to the neutral node N', and the received third phase $PH_C$ is coupled to the neutral node N', wherein the simulated neutral voltage $V_{N'}$ exists at the neutral node N'.

14. A High Resistance Ground (HRG) ground fault detection method configured to detect a HRG ground fault in a HRG system by a high ground fault detector having a base network between a neutral node N' and a ground, the ground fault detection method comprising:
receiving a first phase $PH_A$, a second phase $PH_B$, and a third phase $PH_C$ from the HRG system;
generating a simulated neutral voltage $V_{N'}$ at the neutral node N' from the first phase $PH_A$, the second phase $PH_B$, and the third phase $PH_C$, wherein the simulated neutral voltage $V_{N'}$ comprises a zero voltage potential if the first phase $PH_A$, the second phase $PH_B$, and the third phase $PH_C$ are equal;
comparing the simulated neutral voltage $V_{N'}$ to a predetermined fault voltage threshold; and
detecting a HRG ground fault in the HRG system if the simulated neutral voltage $V_{N'}$ exceeds the predetermined fault voltage threshold.

15. The HRG ground fault detection method of claim 14, further comprising detecting the HRG ground fault in the HRG system independent of a frequency of the first phase $PH_A$, the second phase $PH_B$, and the third phase $PH_C$.

16. The HRG ground fault detection method of claim 14, wherein the HRG system comprises an electric drive coupled to a load comprising an electric motor, further comprising detecting the HRG ground fault in the electric drive independent of a motor speed of the motor.

17. The HRG ground fault detection method of claim 14, with the comparing and detecting further comprising integrating the simulated neutral voltage $V_{N'}$ to generate an integrated voltage $V_{INT}$, with the integrated voltage $V_{INT}$ being substantially constant in amplitude regardless of a frequency of the first phase $PH_A$, the second phase $PH_B$, and the third phase $PH_C$.

18. The HRG ground fault detection method of claim 14, with the comparing and detecting further comprising:
integrating the simulated neutral voltage $V_{N'}$ to generate an integrated voltage $V_{INT}$;
comparing the integrated voltage $V_{INT}$ to a predetermined fault voltage threshold; and
determining the HRG ground fault in the HRG system if the integrated voltage $V_{INT}$ exceeds the predetermined fault voltage threshold.

19. The HRG ground fault detection method of claim 14, wherein:
the comparing comprises:
filtering the simulated neutral voltage $V_{N'}$;
integrating the simulated neutral voltage $V_{N'}$ to generate an integrated voltage $V_{INT}$; and
comparing the integrated voltage $V_{INT}$ to a predetermined fault voltage threshold; and
the detecting comprises determining the HRG ground fault in the HRG system if the integrated voltage $V_{INT}$ exceeds the predetermined fault voltage threshold.

20. The HRG ground fault detection method of claim 14, wherein:
the comparing comprises:
integrating the simulated neutral voltage $V_{N'}$ to generate an integrated voltage $V_{INT}$; and
comparing the integrated voltage $V_{INT}$ to a predetermined fault voltage threshold;
the detecting comprises:
determining the HRG ground fault in the HRG system if the integrated voltage $V_{INT}$ exceeds the predetermined fault voltage threshold; and
determining a fundamental frequency of a faulted phase from the integrated voltage $V_{INT}$.

* * * * *